United States Patent
Lu et al.

(10) Patent No.: US 11,168,401 B2
(45) Date of Patent: Nov. 9, 2021

(54) NANOSTRUCTURED COLOUR FILM HAVING DUAL-PHASE FIRST LAYER AND/OR AMORPHOUS METALLIC SECOND LAYER

(71) Applicant: City University of Hong Kong, Kowloon (HK)

(72) Inventors: Jian Lu, Kowloon (HK); Yu Bu, Kowloon (HK); Ge Wu, Kowloon (HK)

(73) Assignee: City University of Hong Kong, Kowloon (HK)

( * ) Notice: Subject to any disclaimer, the term of this patent is extended or adjusted under 35 U.S.C. 154(b) by 106 days.

(21) Appl. No.: 16/394,332

(22) Filed: Apr. 25, 2019

(65) Prior Publication Data
US 2020/0340125 A1    Oct. 29, 2020

(51) Int. Cl.
| | |
|---|---|
| *C23C 28/00* | (2006.01) |
| *G02B 5/28* | (2006.01) |
| *C23C 14/35* | (2006.01) |
| *G02B 1/00* | (2006.01) |
| *G02B 1/14* | (2015.01) |
| *B82Y 40/00* | (2011.01) |

(52) U.S. Cl.
CPC ............ *C23C 28/345* (2013.01); *C23C 14/35* (2013.01); *C23C 28/323* (2013.01); *G02B 1/00* (2013.01); *G02B 1/002* (2013.01); *G02B 1/14* (2015.01); *G02B 5/28* (2013.01); *B32B 2307/416* (2013.01); *B82Y 40/00* (2013.01); *G02B 1/005* (2013.01); *G02B 5/286* (2013.01)

(58) Field of Classification Search
CPC .............. B32B 7/023; B32B 2307/402; B32B 2307/404; B32B 2307/416; B32B 2551/00; G02B 1/002; G02B 1/005; G02B 1/14; G02B 5/28; G02B 5/285; G02B 5/286
See application file for complete search history.

(56) References Cited

U.S. PATENT DOCUMENTS 7,901,870 B1 *   3/2011   Wach ...................... G02B 5/28
                                                         430/321

* cited by examiner

*Primary Examiner* — Ryan S Dunning
(74) *Attorney, Agent, or Firm* — Renner Kenner Greive Bobak Taylor & Weber

(57) ABSTRACT

A system and a method for a nanostructured film including a first layer for reflecting at least a portion of an electromagnetic radiation and a second layer for receiving the remainder of the electromagnetic radiation through the first layer and subsequently reflecting at least a portion of the received electromagnetic radiation through the first layer, wherein two electromagnetic radiations with the same wavelength reflected by the first and second layers respectively are combined to form a strengthened electromagnetic radiation, the wavelength of the strengthened electromagnetic radiation being variable based on the physical property of the first layer.

23 Claims, 12 Drawing Sheets

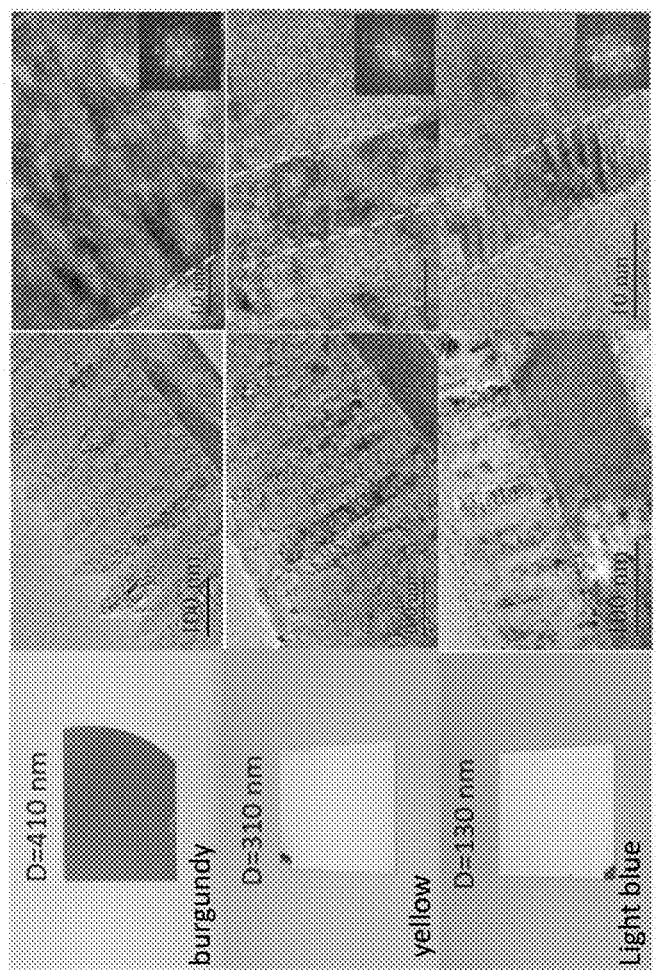
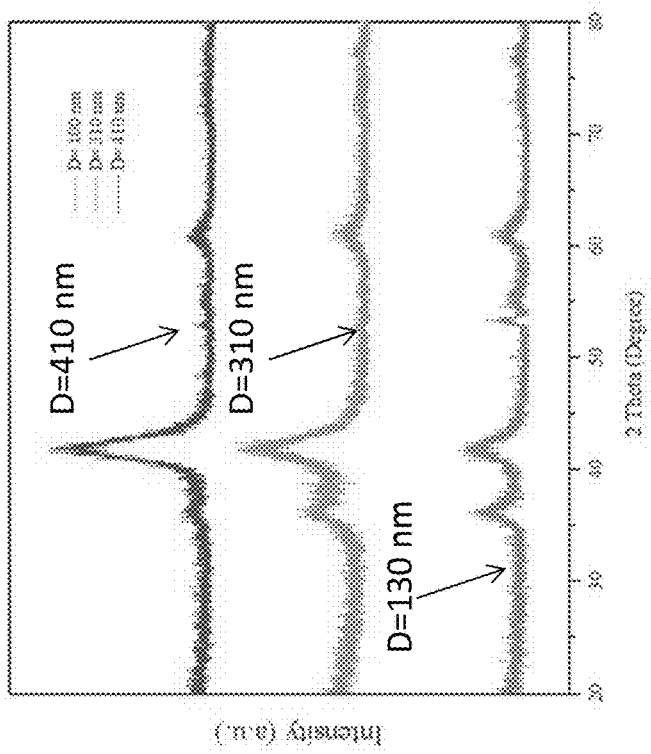
FIG. 3b
FIG. 3a

NANOSTRUCTURED COLOUR FILM HAVING DUAL-PHASE FIRST LAYER AND/OR AMORPHOUS METALLIC SECOND LAYER

FIELD OF INVENTION

The present invention relates to a nanostructured colour film and a method for preparing the same, and particularly, although not exclusively, to a nanostructured colour film with two layers and a method for preparing the same.

BACKGROUND

Hard coatings are commonly used in decorative applications and tribological applications due to their attractive colours and high wear resistance, especially in the terms of communication industry. The colour of the coating is a significant feature to add value to a product where aesthetics is highly important.

SUMMARY OF INVENTION

In an aspect of the invention, there is provided a nanostructured film comprising:
a first layer for reflecting at least a portion of an electromagnetic radiation; and
a second layer for receiving the remainder of the electromagnetic radiation through the first layer and subsequently reflecting at least a portion of the received electromagnetic radiation through the first layer;
wherein two electromagnetic radiations with the same wavelength reflected by the first and second layers respectively are combined to form a strengthened electromagnetic radiation, the wavelength of the strengthened electromagnetic radiation being variable based on the physical property of the first layer.

Preferably, the wavelength of the electromagnetic radiation reflected by the first layer is manipulated by the physical property.

Preferably, the physical property includes at least one of the reflectivity and the dimension.

Preferably, the two reflected electromagnetic radiations interact with each other to form a visible electromagnetic radiation with a predetermined colour.

More preferably, the two reflected electromagnetic radiations with the same wavelength form the visible electromagnetic radiation by way of constructive interference.

Preferably, the first layer is arranged to undergo chemical reaction with oxygen and the reflectivity of the first layer is manipulated by content of the oxygen in the chemical reaction.

More preferably, the reflectivity of the first layer is proportional to the oxygen content.

More preferably, the electronic structure of the first layer is manipulated by the oxygen content and the colour of the film is manipulated by the electronic structure.

Furthermore preferably, a portion of the electromagnetic radiation is absorbed by the electrons in the electronic structure of the first layer.

Preferably, the first layer is dual-phase.

More preferably, the dual-phase includes at least one of crystalline phase and amorphous phase.

Further more preferably, the first layer is a layer of metal-oxide with nanocrystals embedded in an amorphous matrix.

Preferably, the reflectivity of the first layer is manipulated by the thickness of the first layer.

Preferably, the reflectivity of the first layer is proportional to the thickness of the first layer.

Preferably, the first layer has a reflectance ranged from 10% to 100%.

Preferably, the second layer is metal or non-metal.

Preferably, the second layer is an amorphous metallic layer.

More preferably, the non-metal is selected from Si wafer, fused $SiO_2$, glass, ceramics, and polymer.

Preferably, the first layer has a thickness equal to or greater than 1 nm.

More preferably, the first layer has a roughness of no more than 100 nm.

Preferably, the first layer is non-metal.

Preferably, the first layer includes metal oxide.

More preferably, the metal is selected from a group comprising Mg, Zn, Ca, Al, Ti and the combination thereof.

Preferably, the first layer is formed by at least one of magnetron sputtering, vacuum evaporation, sputter coating, plasma coating, and ion plating.

Preferably, the nanostructured film has a Vickers hardness of no less than 2 GPa.

In another aspect of the invention, there is provided a method for preparing a nanostructured film, comprising the steps of:
(a) providing a first layer of a first material; and
(b) depositing of a first material onto the first layer thereby forming an electromagnetic radiation reflectable and refractable second layer on the first layer.

Preferably, the second layer is deposited on the first layer in a sputtering process.

More preferably, the first layer is metal or non-metal.

More preferably, the sputtering process includes a magnetron sputtering process.

Further more preferably, the magnetron sputtering process is carried out with the following parameters:
vacuum state ranging from $10^{-1}$ to $10^{-9}$ Pa
working pressure ranging from 0.1 to 10 Pa
power ranging from 20 to 2000 W,
reaction gas: at least one of $O_2$, $N_2$, $H_2$,
flow rate of reaction gas: 0 to 100 sccm
pressure of reaction gas: 0 to 10 Pa
substrate temperature ranging from 0 to 1000° C.
substrate bias ranging from −500 to 500 V

BRIEF DESCRIPTION OF DRAWINGS

It will be convenient to further describe the present invention with respect to the accompanying drawings that illustrate possible composition, structure and property of the invention. Other compositions and structures of the invention are possible, and consequently the particularity of the accompanying drawings is not to be understood as superseding the generality of the preceding description of the invention.

FIG. 3a shows the X-ray Powder Diffraction (XRD) of three MgZnCaO thin films with different thickness;

FIG. 3b shows the Transmission electron microscopy (TEM) image of three MgZnCaO thin films with different thickness;

FIG. 4 shows the 2 hours salt spray corrosion test result of the MgZnCaO thin film of FIG. 2a;

DETAILED DESCRIPTION

Figure 1A:
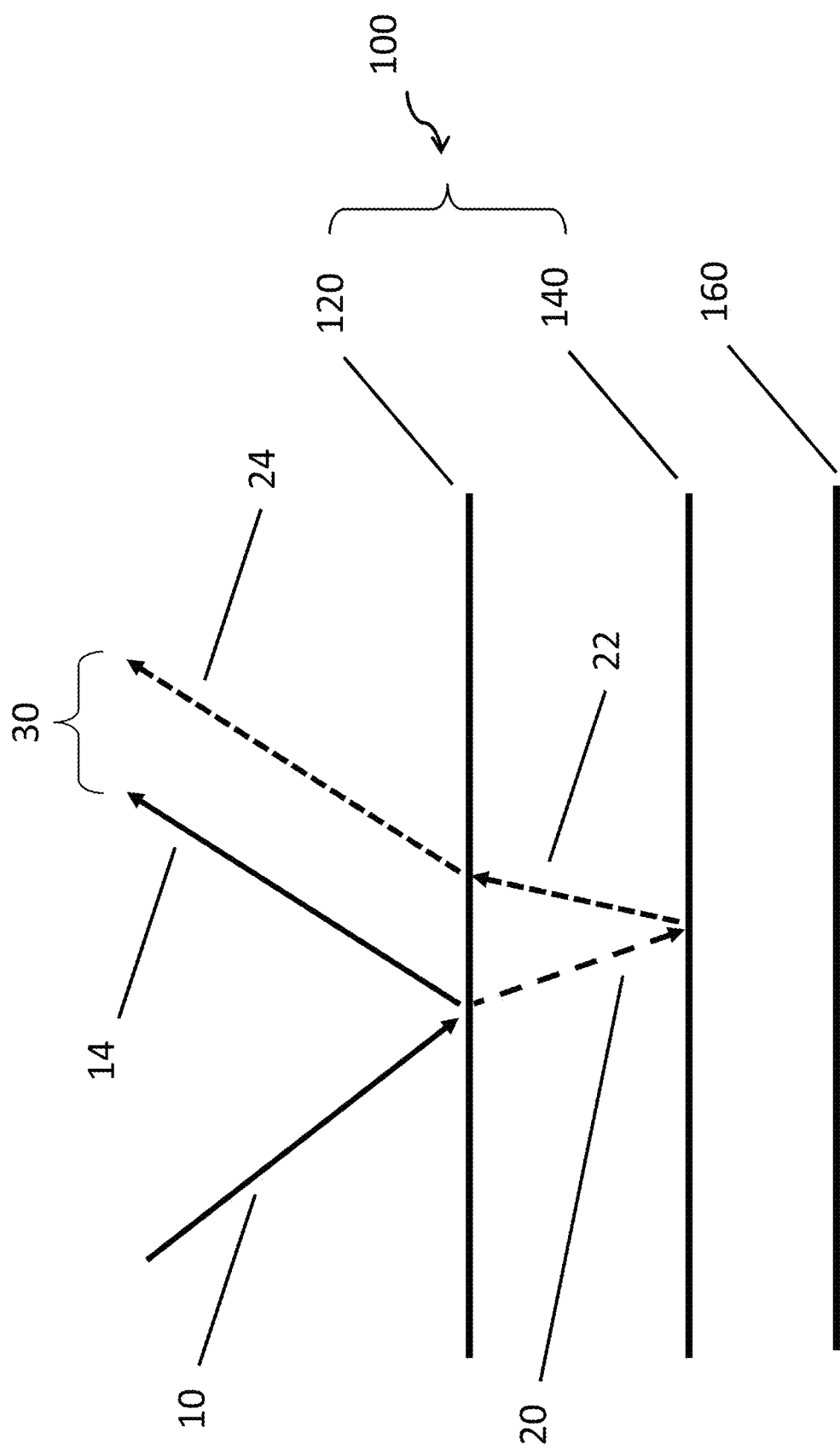
FIG. 1a is a schematic diagram showing the structure of a nanostructured film in accordance with the present invention.

At present, there are only a few methods that can be used to colourize surface, such as physical vapor deposition thin film electroplating, chemical treatment, laser irradiation. Although metallic materials are widely used, it will gradually be replaced by non-metallic materials such as plastic materials. For instance, this may be due to the advent of the 5G communication. However, plastic materials have several shortcomings, for example they may be scratched easily and colour films on-top will conceivably be detached and deformed due to poor adhesion. On the other hand, glass and ceramic materials are often fragile or easily cracked due to their low strengths and deformation ability.

There is a long felt need of a non-metallic material which may exhibit excellent strength yet it would be suitable for various applications for example in the future telecommunication technology.

Without wishing to be bound by theories, the inventors, through their own trial, research and experiments, have devised an economical, green and efficient coating method for preparing a dual-phase nanostructured optical film with high hardness, scratch resistance and corrosion resistance, and enabled with vibrant colours.

Referring initially to FIG. 1, there is provided a nanostructured film 100, comprising a first layer 120 for reflecting at least a portion of an electromagnetic radiation 10; and a second layer 140 for receiving the remainder of the electromagnetic radiation 20 through the first layer 120 and subsequently reflecting at least a portion of the received electromagnetic radiation 20 through the first layer 120. The two electromagnetic radiations 14, 24 with the same wavelength reflected by the first and second layers 120, 140 respectively are combined to form a strengthened electromagnetic radiation 30, the wavelength of the strengthened electromagnetic radiation 30 being variable based on the physical property of the first layer 120.

The inventors have also devised a method for preparing a nanostructured film 100, comprising the steps of: (a) providing a first layer 140 of a first material; and (b) depositing a second material onto the first layer 140 thereby forming an electromagnetic radiation reflectable and refractable second layer 120 on the first layer 140.

Naturally, each object has one or more unique colour(s). The colour of an object observed by human being is determined by the colour of the light reflected by the object. An electromagnetic radiation within a specific spectrum e.g. visible light is first emitted onto the surface of the object. In turn, the electromagnetic radiation with specific wavelength reflects off the object surface and subsequently hits the light-sensitive retina at the back of a human eye.

Turning now to the detailed description of the present invention, there is provided a multilayer film 100, in particular, a nanostructured film 100 as depicted in FIG. 1a with stacked multilayers e.g. at least two layers 120, 140 each made of reflective material. The physical property of the layers 120, 140 determines the light 14, 20, 22 and 24 reflected and refracted by the layers 120, 140. In particular, the physical property of the first layer 120 determines the light 20 received by the second layer 140 underneath. As a result, the light 20 reflected by the second layer 140 is eventually manipulated by the physical property of the first and second layers 120, 140.

Preferably, the first layer 120 may be a non-metal layer metal oxide film, preferably including one or more of MgO, ZnO, CaO, Al2O3, TiO$_2$ e.g. Mg based film formed by treating an alloy under chemical reaction. The first layer 120 has a reflectance ranged from 10% to 100%. Advantageously, the first layer 120 exhibits a pleasant colour and is a suitable candidate for fabricating colourful coating materials. To manipulate the colour of the multilayer film 100, the alloy first layer 120 may be subjected to chemical reaction with various parameters, thereby forming a thin film 140 with a specific dimension, i.e. thickness and reflectivity i.e. refractive index. Preferably, each of the formed first and second layers 120, 140 may be at least 1 nm thick.

Figure 1B:
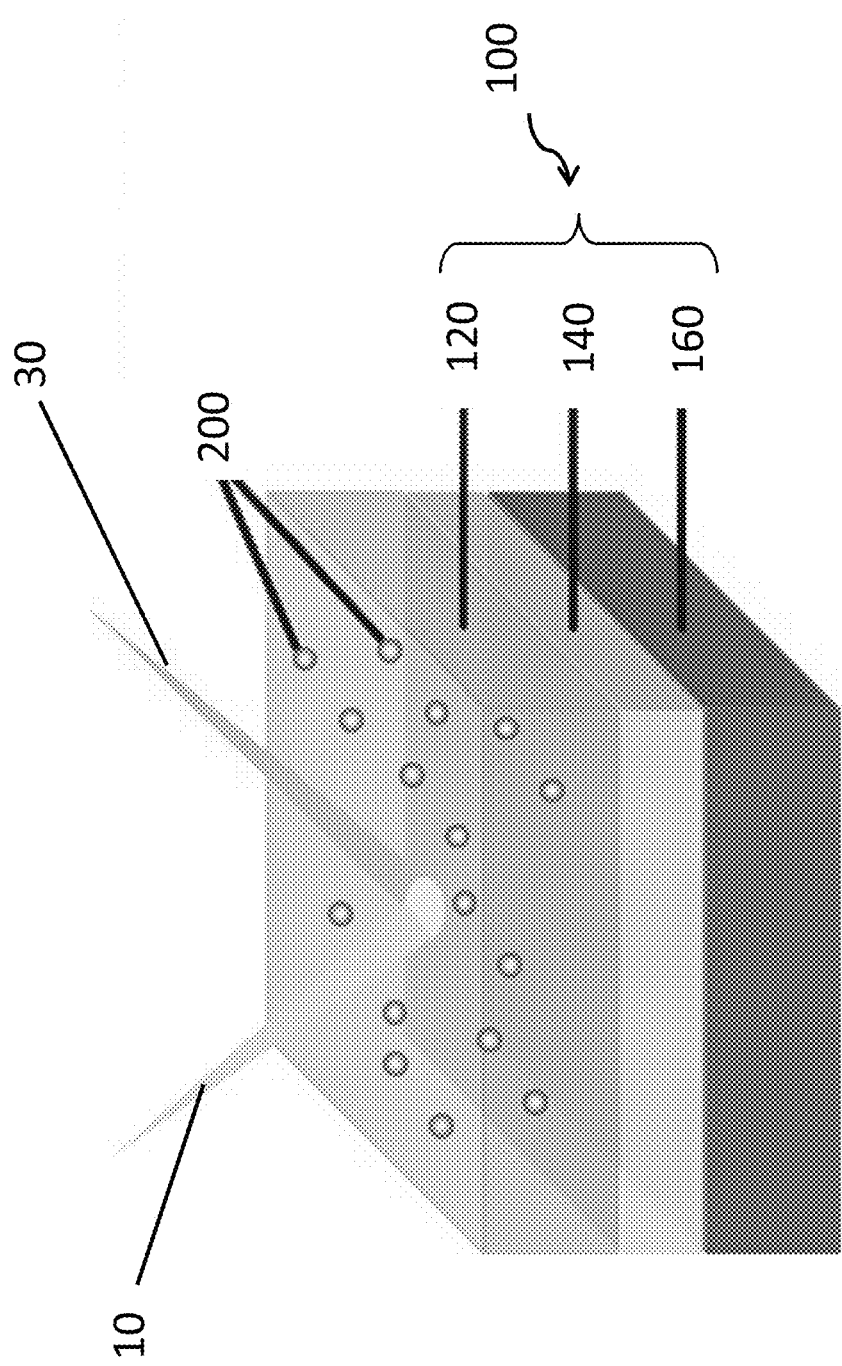
FIG. 1b is a schematic diagram showing the structure of a nanostructured film with oxygen vacancies in accordance with the present invention.

Referring to FIG. 1b, the first functional layer 120 may include a plurality of stacked layers. In this configuration, there is also provided a plurality of oxygen vacancies 200 on the first layer 120. The presence of such oxygen vacancies 200 would facilitate the colour-changing mechanism.

The second layer 140 may be a metal element e.g. a metal layer formed by alloy, preferably magnesium alloy e.g. MgZnCa alloy in a disk shape e.g. fabricated with low temperature fabrication process. The second layer 140 also has a reflectance ranged from 10% to 100%. Preferably, the fabricated MgZnCa alloy shown three times the increase in strength, and an elastic limit nearly four times higher than those of commercial Mg alloys, which makes the MgZnCa alloy as a promising hard coating material. Alternatively, the layer 140 may also be other metals such as Magnesium, Zinc, Calcium, Aluminium, Titanium, other metal alloys including one or more aforementioned metal elements and non-metals such as Si wafer, fused SiO$_2$, glass, ceramics, and polymers etc.

Advantageously, both first and second layers 120, 140 may be dual-phase of amorphous structure and crystalline, bi-crystalline phase, or bi-amorphous phase. The amorphous structure may include nano-amorphous phase and the crystalline structure may include nanocrystalline phase. By manipulating the structure of the first layer 120, the colour of the film 100 may be fabricated in desirable colours.

Preferably, the dimensions of bi-crystalline phase and bi-amorphous phase may be ranged from 5 nm to 200 nm. Preferably, the ratio of the volume of amorphous phase to the overall volume in the dual-phase of amorphous structure and crystalline is ranged from 0% to 60%.

In one example embodiment, the dual-phase system may be a magnesium-alloy system which includes nanocrystalline cores embedded in amorphous glassy shells. This structural configuration combines the strengthening benefits of nanocrystallinity with those of amorphization to produce a dual-phase material that exhibits near-ideal strength at room temperature and without sample size effects.

In one alternative example embodiment, the first layer 120 may be a layer of metal-oxide with nanocrystals embedded in an amorphous matrix for targeted colors, and the second layer 140 may be an amorphous metallic layer for reflection.

There is also provided a substrate 160 for depositing the first and second layers 120, 140 thereon during the fabrication of the film 100. Preferably, substrate 160 may be metal, non-metal, metal composite, non-metal composite or polymer embodied in any three-dimensional appearance. An alloy layer 140 is first deposited onto the substrate 160 and a portion of the alloy layer 140 e.g. the top surface is then subjected to chemical reaction, thereby forming the non-metal film 120. The formed film 100 with stacked oxide layer 120 and alloy layer 140 is then removed from the substrate 160 for further fabrication.

In one example embodiment, there is provided a nano structured colour film 100 based on Mg-based alloy layer 140 preferably via sputtering technology, and more preferably via magnetron sputtering technology or other physical vapor deposition (PVD) method such as vacuum evaporation, sputter coating, plasma coating, ion plating. The electromagnetic radiation is a visible light. In order to form a metal oxide film 120 preferably MgO, ZnO, and/or CaO on the layer 140 thereby generating a controllable colour, a MgZnCa alloy disk 140 with a nominal composition is first fabricated by vacuum sintering of high purity elemental powders (99.99% Mg and 99.99% Zn, 99.5% Ca) as a target for the direct-current magnetron sputtering. The sputtering may be carried out in the atmosphere of a mixture of a noble gas such as Ar and a reactive gas such as $O_2$, $N_2$ and $H_2$, and more preferably in a mixture of Ar and $O_2$ (purity>99.99%). Alternatively, other metal or non-metal materials may also be used as the target.

The advantages of the method disclosed by the present invention in that, magnetron sputtering ensures the film is densely grown on various substrates 160, including materials with complex shapes such as 3D printed glass/ceramics, with good adhesion. It is industrial compatible, automatically controllable, low cost, high performance and environmental friendly for large scale production with wide applications.

During the example sputtering process, MgZnCaO thin films 120 are produced by the chemical reaction between the target MgZnCa alloy 140 and the reactive gas $O_2$. Preferably, the vacuum state is ranged from $10^{-1}$ to $10^{-9}$ Pa; the working pressure is ranged from 0.1 to 10 Pa; the power is ranged from 20 to 2000 W; the flow rate of reaction gas is ranged from 0 to 100 sccm, preferably 0 sccm, 3 sccm, 5 sccm and 7 sccm; the pressure of reaction gas is ranged from 0 to 10 Pa; the argon pressure is ranged from 0 to 0.6 Pa, preferably 0.5 Pa; the substrate temperature is ranged from 0 to 1000° C., preferably at room temperature; the substrate bias voltage is ranged from −500 to 500 V, preferably 50 V; and the deposition rate is ranged from 1~50 nm min$^{-1}$, preferably 11 nm min$^{-1}$.

The inventors have devised that the colours adjustment of the thin films 100 is mainly governed by synergistic effect of oxygen vacancies 200 of the Mg-based materials 120 and substrate layer 140 and interference effect between the substrate layer 140 and Mg-based materials 120.

When the oxygen flux is adjusted during the process of sputtering, the electronic structure will be adjusted with the oxygen vacancies 200. The removal of an oxygen atom from a metal oxide 120 leaves two extra electrons in the crystal. In light metal oxide 120, such as MgO or CaO, where the oxide free energy of formation is high, oxygen vacancies 200 create deep charge localized states within the electronic band gap known as colour center. In contrast, a relatively low formation energy of ZnO favours large oxygen deficiencies and thus gives rise to the free carrier densities.

Preferably, the combination of the MgZnCaO coatings 120 and the thin metallic films MgZnCa 140 underneath may serve as partial and full reflectors. Optionally, the wavelength-scale-thick films 100 e.g. dielectric films may rely on Fabry-Perot-type or thin-film interference to achieve brilliant colours.

Figure 2A:
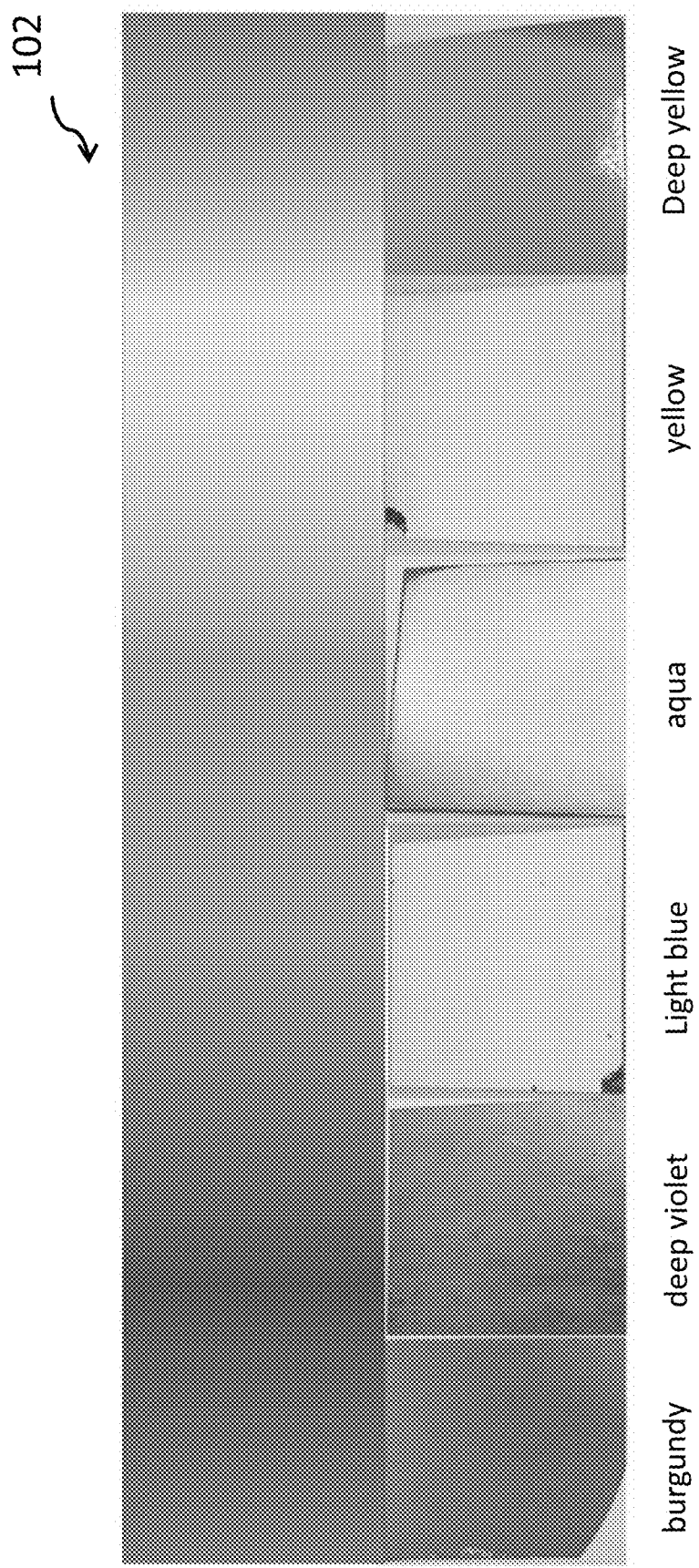
FIG. 2a shows the photos of the MgZnCaO thin films in accordance with the present invention with different colours corresponding to the visible range spectrum.

Referring to FIG. 2a, there is shown various MgZnCaO thin films 120 with different colours corresponding to the visible light spectrum as prepared in accordance with the present invention. Preferably, these MgZnCaO thin films 120 may achieve thicknesses ranged from 1 nm to 1 μm, particularly 110-530 nm, surface roughnesses (Ra) of 50 nm and maximum surface roughnesses (Rt) of no more than 100 nm.

Preferably, the colour of the films 100 may be manipulated to cover the entire visible range spectrum by adjusting $O_2$ flux and film thickness. The colours may cover yellow, aqua, blue and burgundy by conducting magnetron sputtering with different sputtering parameters. The thin films 100 exhibit an intrinsically silver colour in oxygen-free samples. In contrast, the thin films 100 with various oxygen contents exhibit brilliant colours and metallic lusters. Besides, the thickness of thin film 100 also has a remarkable effect on the colour variation of the Mg-based thin films.

The colour-structure relationship for the MgZnCaO thin film 120 is explained with reference to the microstructure of the coloured samples examined by XRD and TEM. FIG. 3a shows the XRD patterns of as-deposited MgZnCaO thin film 120 with different thickness of 130 nm, 310 nm, 410 nm grown with the fixed oxygen flux (3 sccm) on Si wafer 140. The two stronger diffraction peaks of the samples at 2θ of 36.3 and 42.7 can be indexed to (111), (200), (220) of MgZnO cubic structure respectively. No characteristic diffraction peaks of Ca oxides are observed possibly due to the lower loading content and weak crystallization. Chemical composition may be identified by ICP as shown in Table 1. The samples prepared under 0 sccm $O_2$ flux ($O_2$ free), 3 sccm $O_2$ flux and 5 sccm $O_2$ flux are annotated as 0O, 3O and 5O respectively.

TABLE 1

Composition and adhesion strength of various
Mg-based thin films 120 with the same thickness
(120 nm) deposited on glass substrates 160

| Samples | Concentration (at %) | | | Hardness (Gpa) | Adhesion (N) |
| --- | --- | --- | --- | --- | --- |
| | Mg | Zn | Ca | | |
| $O_2$ = 0 sccm | 48.78 | 28.55 | 3.63 | 6.12 | 1.50 ± 0.1 |
| $O_2$ = 3 sccm | 42.65 | 21.74 | 2.78 | 6.44 | 1.21 ± 0.1 |
| $O_2$ = 5 sccm | 18.20 | 11.82 | 1.27 | 9.12 | 1.17 ± 0.1 |

Microstructure and crystal structure of the coatings 100 are analyzed by TEM. FIG. 3b shows an overview of the whole coating 100 with the colour forming layers MgZnCaO 120 and the pre-sputtered reflective MgZnCa 140. It can be seen from FIG. 3b that the MgZnCa layer 140 has a thickness of about 90 nm and the MgZnCaO layer 120 has a thickness of about 310 nm. Both layers 120, 140 are dual-phase of amorphous structure and crystalline. The columnar crystalline of MgZnCaO 120 has a width between 40-50 nm, and the size grows with the deposition time. In this work, purely cubic structure is observed. The corresponding fast furrier transform (FFT) of the columnar grain recorded also shows typical cubic type structure.

Hardness of the thin films 100 also affects their practical applications. In this example, the Vickers hardness of all the thin films 100 are all above 2 GPa, as is summarized in Table 1. It can be seen that the hardness of the 0O, 3O and 5O samples are 6.12, 6.44 and 9.12 respectively. This indicates that the hardness increases with the increase of $O_2$ flux.

Table 1 also shows the adhesion strength between the thin film 120 and substrate layer 140, which is also important for the practical applications. It shows that the adhesion strengths for the 0O, 3O and 5O samples are 1.5, 1.21 and 1.17 respectively. Advantageously, the Mg-based oxides thin films 120 show an adhesion strength that is high enough for practical applications.

In one example embodiment, there is provided a method for preparing a nanostructured film 102 as depicted in FIG. 2a. Initially, MgZnCa target is subjected to pre-treatment. For instance, upon polishing the substrate surface with sandpaper, the target is then subjected to ultrasonic cleaning in acetone, ethanol and deionized water. The pre-treated sample is then placed in the target position of the magnetron sputtering coating machine. A three dimensional glass plate is also subjected to ultrasonically cleaning in ethanol and deionized water for 20-30 minutes for removing the surface impurities. The cleaned substrate is then placed in the magnetron sputtering coating machine.

The coating machine is first evacuated to a vacuum state of $10^{-3}$ to $10^{-9}$ torr. To obtain the desirable nanostructured colour film, the power is adjusted and argon is introduced for performing plasma pre-treatment. Accordingly, impurity atoms would be removed from the target surface. This improves the film-based bonding force. Once the pre-treatment is complete, the coating treatment is performed by adjusting the power and under a temperature between room temperature and 1000° C. Meanwhile, Ar and $O_2$ or $N_2$ are introduced for coating. The film thickness would be no less than 1 nm and more preferably ranged from 50 to 5000 nm and the colour would be silver white and bright yellow etc.

Figure 4:
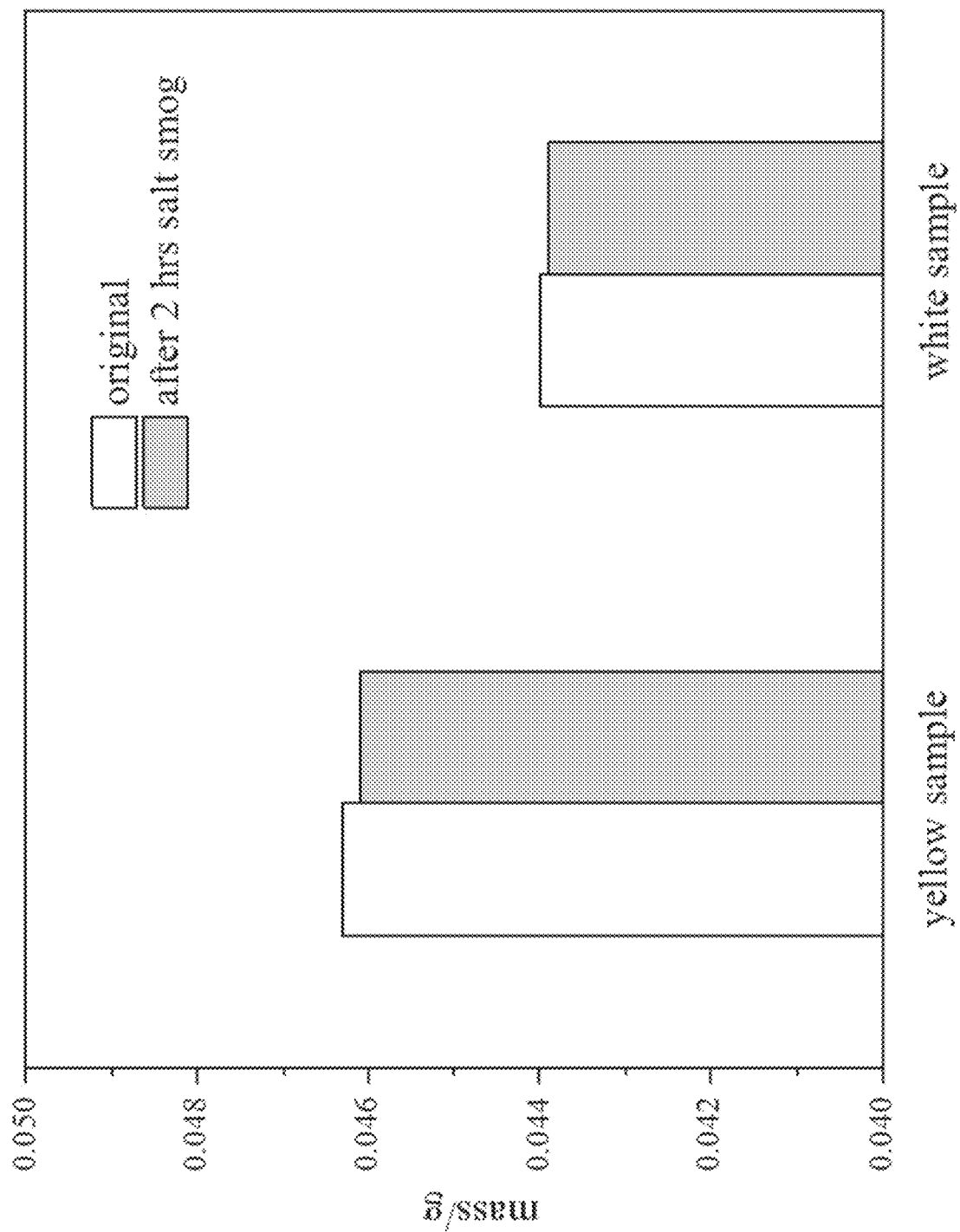

To assess the durability of the nanostructured film 102, two sets of bright yellow and silver white samples are tested for the corrosion resistant. A first set of bright yellow and silver white samples are subjected to 2 hours salt smog and then compared with the second set of untreated bright yellow and silver white samples. The result shown in FIG. 4 indicates only negligible changes in mass before and after the salt smog treatment on the bright yellow and silver white samples. As such, the nanostructured film 102 has a high resistance to salt spray corrosion and possess excellent anti-seat ability.

Figure 2B:
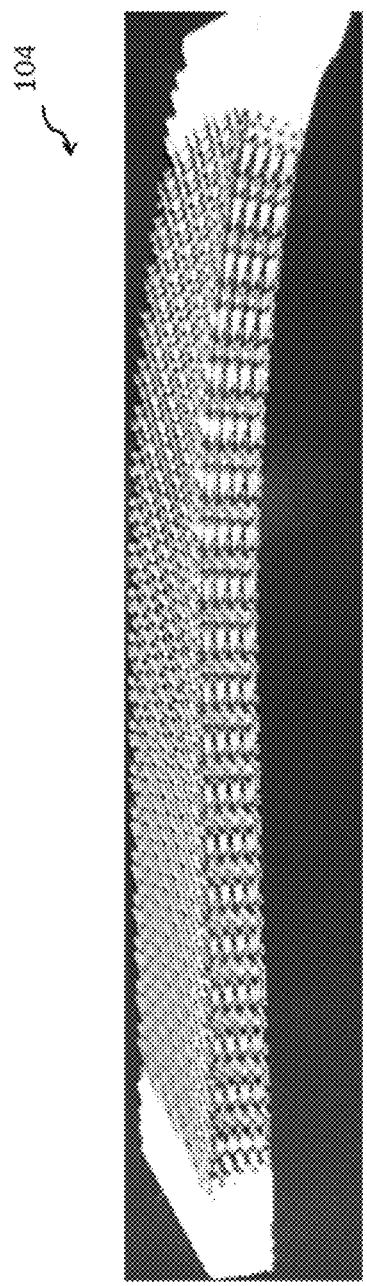
FIG. 2b shows the photo of the MgZnCaO thin film formed on a soft material substrate in accordance with the present invention.
Figure 2C:
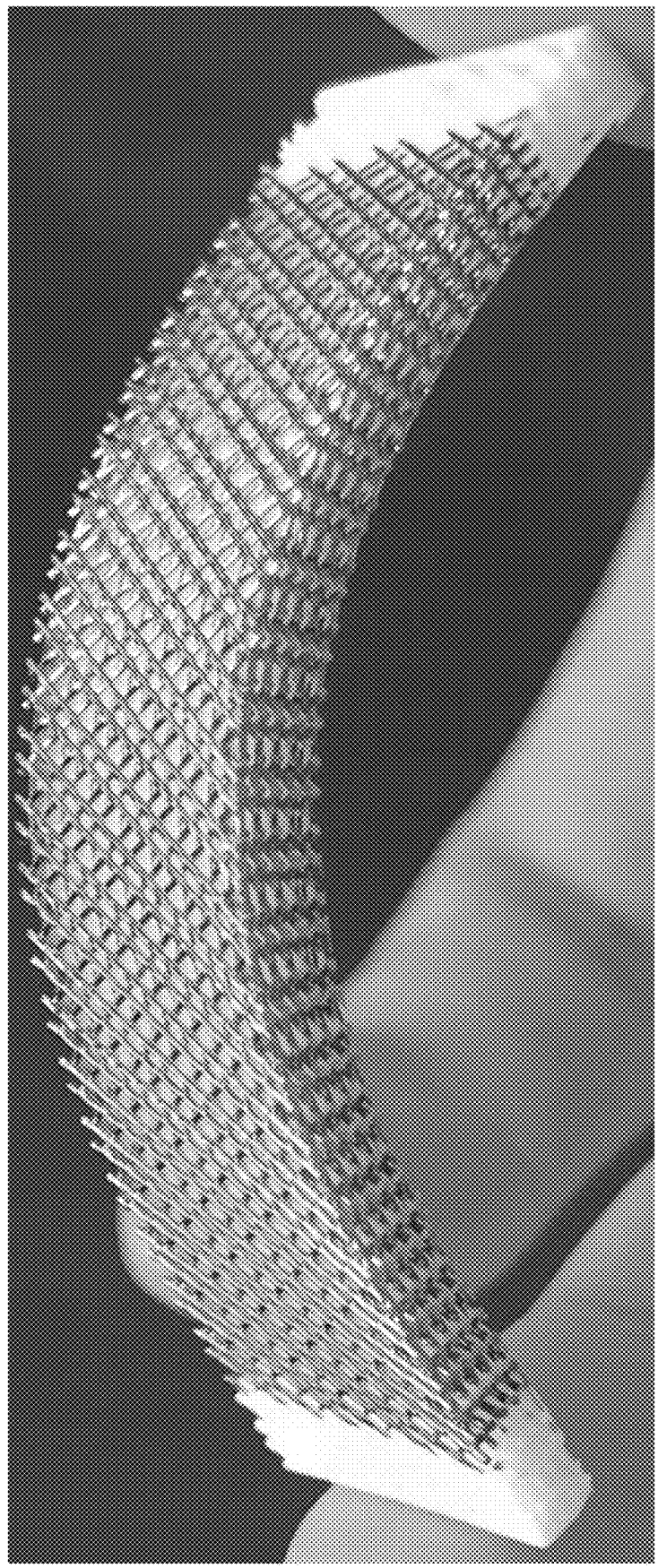
FIG. 2c shows the flexibility of the MgZnCaO thin film of FIG. 2b.

Referring to FIGS. 2b to 2c, there is also shown a nanostructured film 104 with a flexible behaviour. The nanostructured film 104 is flat in a default configuration, as depicted in FIG. 2b. Upon exerting a bending force on the two ends, the nanostructured film 104 forms a domed shape and restores its flat shape when the bending force is released. The nanostructured film 104 has a high elasticity and thus suitable for compressive or tensile applications.

In one example embodiment, there is provided a method for preparing such a flexible nanostructured film 104 as depicted in FIGS. 2b and 2c. Initially, MgZnCa target is subjected to pre-treatment. For instance, upon polishing the substrate surface with sandpaper, the target is then subjected to ultrasonic cleaning in acetone, ethanol and deionized water. The pre-treated sample is then placed in the target position of the magnetron sputtering coating machine. A soft base is also subjected to ultrasonically cleaning in ethanol and deionized water for 20-30 minutes for removing the surface impurities. The cleaned substrate is then placed in the magnetron sputtering coating machine.

The coating machine is first evacuated to a vacuum state of $10^{-3}$ to $10^{-9}$ torr. The power is adjusted and argon is introduced for performing plasma pre-treatment. Accordingly, impurity atoms would be removed from the target surface. This improves the film-based bonding force. Once the pre-treatment is complete, the coating treatment is performed under room temperature. Subsequently, the power may be adjusted and the temperature may also be adjusted between room temperature and 100° C. Meanwhile, Ar and $O_2$ or $N_2$ are introduced for coating. The film thickness would be 100 to 5000 nm and the colour would be silver white and silver grey etc.

Figure 5:
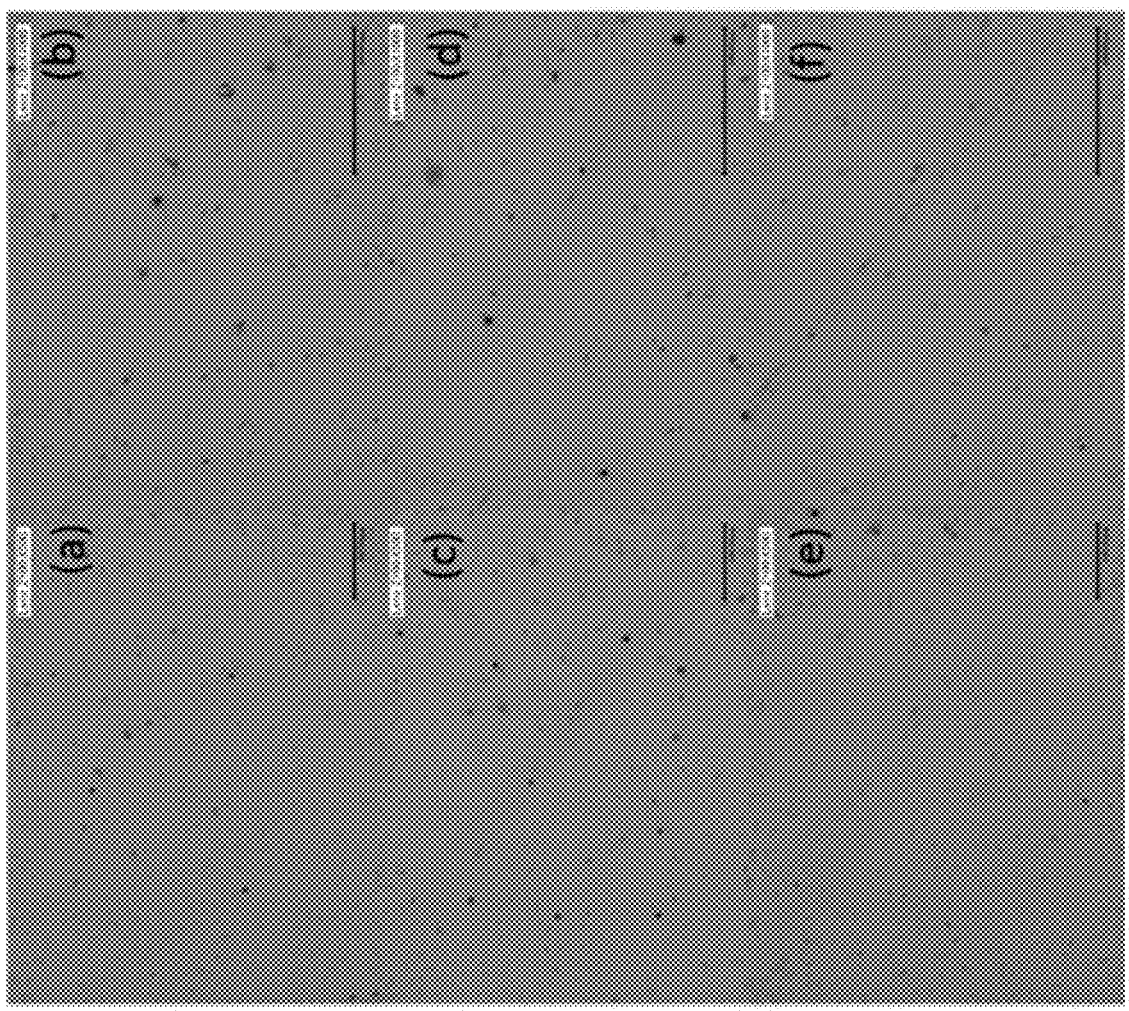
FIG. 5 shows the micro scratch test result of the MgZnCaO thin film of FIGS. 2b to 2c.

To assess the hardness of the samples, six samples of nanostructured film 104 are subjected to microscratch test. Referring to FIG. 5, there are rarely a few indentations on the surface. This indicates that the nanostructured film 102 has high scratch resistance and is not susceptible to wearing.

The inventors have further devised that partial pressure of $O_2$ also has a remarkable effect on the colour variation of the thin films 100. An F-center is a type of crystallographic defect in which an anionic vacancy in a crystal is filled by one or more unpaired electrons. Electrons in such a vacancy tend to absorb light in the visible spectrum and thus such a material that is usually transparent becomes coloured.

The electron concentration increases with the reduction of oxygen flux and thus more oxygen vacancies appear in the thin film 100. The oxygen vacancies will affect the electronic structure in the thin film 100 and consequently affect the colour of the film 100. To quantitatively characterize the electronic structure of the films 100, the optical energy band gap (Eg) of thin films 100 with different oxygen content was calculated on the basis of the corresponding absorbance spectrum.

Based on band gap theory, the optical energy gap (Eg) is calculated from the absorption coefficient using the equation (1):

$$Ahv = \beta(hv - Eg)^{1/2} \qquad (1)$$

where hv is the photon energy and A is the absorbance.

Eg can be deduced from the hv~(Ahv)² plots. The data of Eg shows a correlation between Eg and oxygen content and more particularly, Eg increases with deducing of oxygen flux. The 3O sample, whose Eg (3.94 eV) is smaller than the ultra violet threshold energy (4.5 eV), is therefore semi-transparent due to the absorption of part of the visible light.

In contrast, the 5O and 7O samples exhibit a widening band gap of approximately 4.17 eV, 4.22 eV, respectively. As a result, certain threshold energy within the visible region is absorbed, resulting in partial transparency. This demonstrates that the oxygen vacancies change the electronic structure of the MgZnCaO thin film 120 and thus leads to the colourization of the thin films 100.

To gain further insights into the differences in the optical properties of the MgZnCaO thin films 120 with different thickness, the reflectivity is determined by spectrophotometry test. The formation of intense interference colours is presented via depositing a semi-transparent material 120 over a reflective layer 140. The interference effect occurs when the light is reflected from two or more interfaces in the stack of thin films 120, 140.

In such case, visible light can be separated into two parts: one part 14 is reflected at the film/air interface 120, and the other 20 penetrates in the MgZnCaO thin films 120 and is ultimately reflected at the film/substrate interface 140. The constructive interference between the reflected light 14 from the MgZnCaO thin films 120 top surface and the emergent lights 22, 24 reflected on the MgZnCaO thin films-substrate interface 140 caused the different colours. As the colours of the samples are mainly determined by the interference band with the maximum reflectance in the visible region, and the wavelength at the maximum reflectance in each interference band can be obtained by the equation (2):

$$\lambda = \frac{2nd}{m} \quad (2)$$

where m is the interference order, n and d are the refractive index and thickness of the thin films respectively.

Based on equation 2, λ varies with the film thickness d, and in turn this results in the alteration of colour of the thin films 100. Accordingly, the maximum reflectance index depends on the optical constants of the thin film 120 and reflective substrate layer 140, and on the thickness of the thin film 120.

Figure 6B:
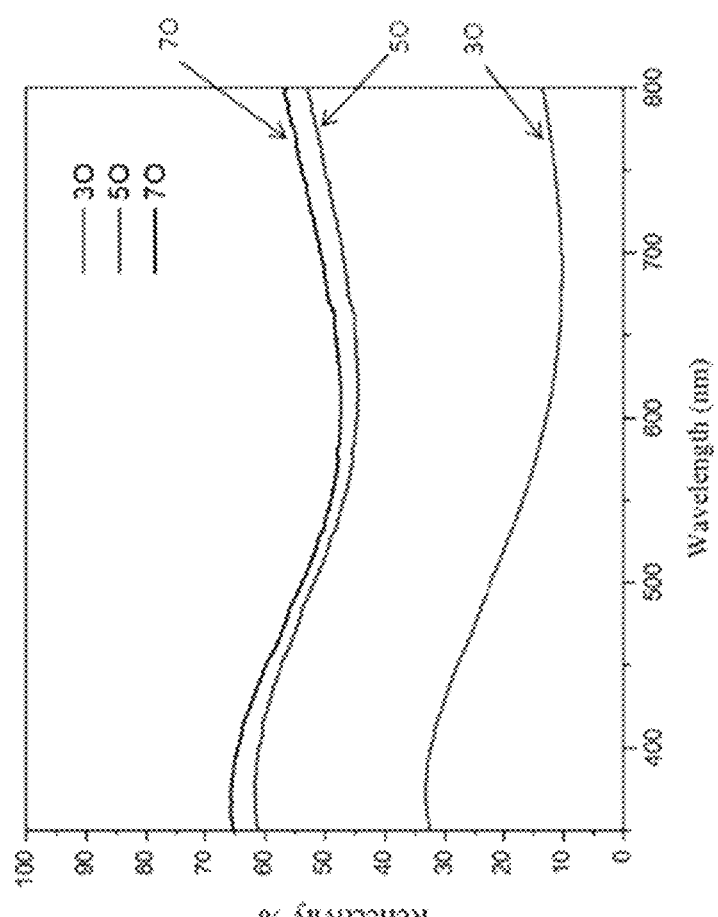
FIG. 6b shows reflectivity spectra of the as-prepared Mg-based thin film.
Figure 6A:
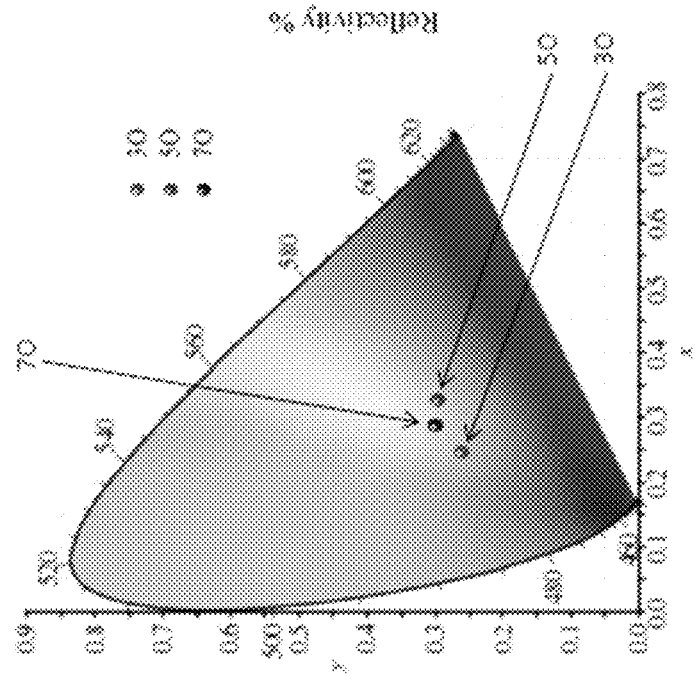
FIG. 6a is a CIE 1931 chromaticity diagram of films with different oxygen partial pressure.

FIG. 6a shows the colours of the MgZnCaO layer 120 with the same thickness of 130 nm treated under different oxygen content evaluated in the CIE 1931 chromaticity diagram. The samples prepared under 3 sccm O₂ flux, 5 sccm O₂ flux and 7 sccm O₂ flux are annotated as 3O, 5O and 7O respectively. By increasing the oxygen content from 3O to 7O, the colour is slightly shifted within the range of 0.25 to 0.35 in the x-axis and of 0.27 to 0.3 in the y-axis. The reflectivity of samples with the same thickness of 130 nm treated under different oxygen content are shown in FIG. 6b. It demonstrates that the reflectivity of the thin film 120 is proportional to the O₂ content. The 5O, 7O samples have higher reflectivity comparing to the 3O sample.

Figure 7B:
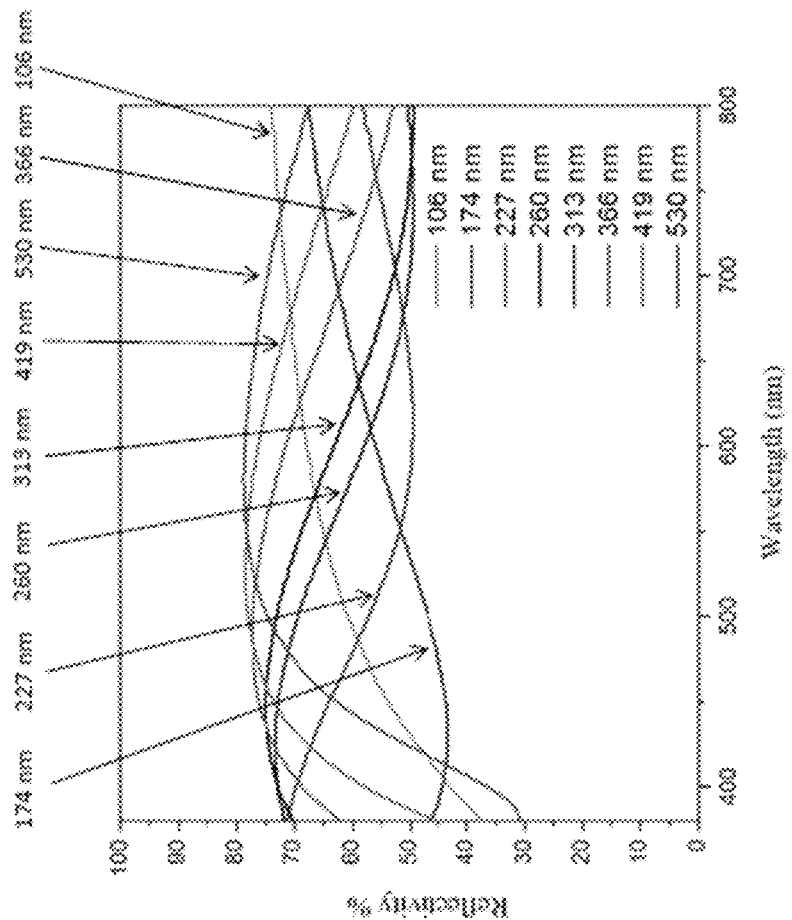
FIG. 7b shows reflectivity spectra of the as-prepared Mg-based thin film.
Figure 7A:
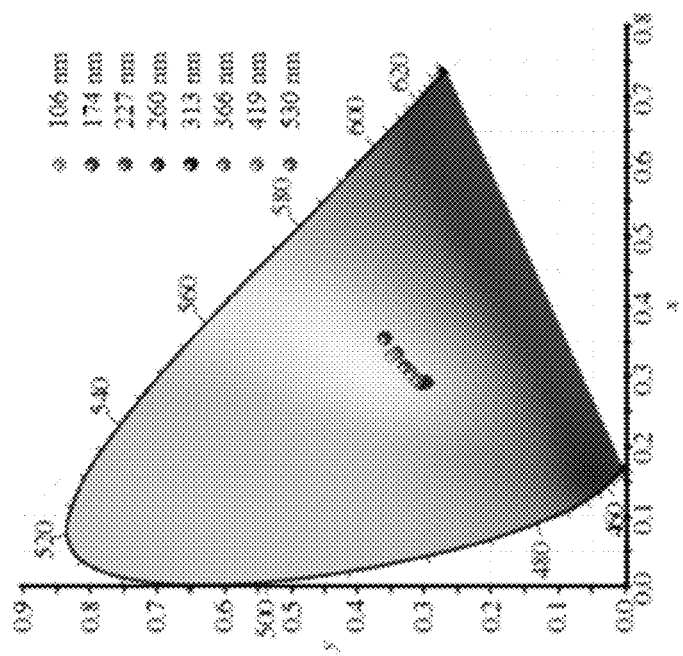
FIG. 7a is a CIE 1931 chromaticity diagram of films with different thickness.

FIG. 7a shows the colours of the MgZnCaO layer 120 with different thickness treated under the same oxygen content evaluated in the CIE 1931 chromaticity diagram. By increasing the thickness of the film from 106 nm to 530 nm, the colour is slightly shifted within the range of 0.28 to 0.35 in the x-axis and y-axis. FIG. 7b depicts the reflectivity of the samples with different thickness under the same oxygen content of 3 sccm. It shows that the reflectivity of the MgZnCaO layer 120 is proportional to the film thickness. With the increase of the thickness of the MgZnCaO layer 120 ranging from 227 nm to 530 nm, the maximum reflectance is increased and the corresponding wavelength is shifted to the longer wavelengths. Such behaviour is typical for the interference effect. According to FIG. 7b, the reflectivity of the thin films is ranged between 30% and 80%.

Figure 8A:
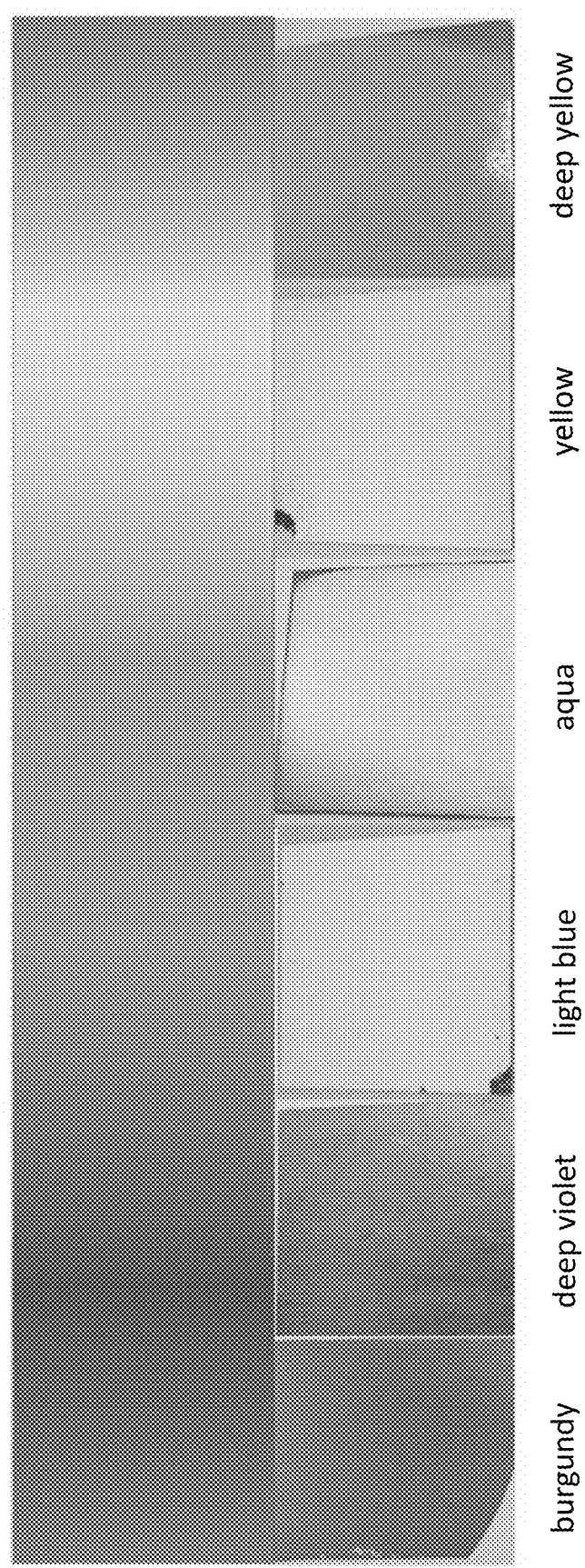
FIG. 8a shows a number of Mg-based thin films prepared by synergistic effect of oxygen vacancies and interference effect, each having different colours corresponding to the visible range spectrum.
Figure 8C:
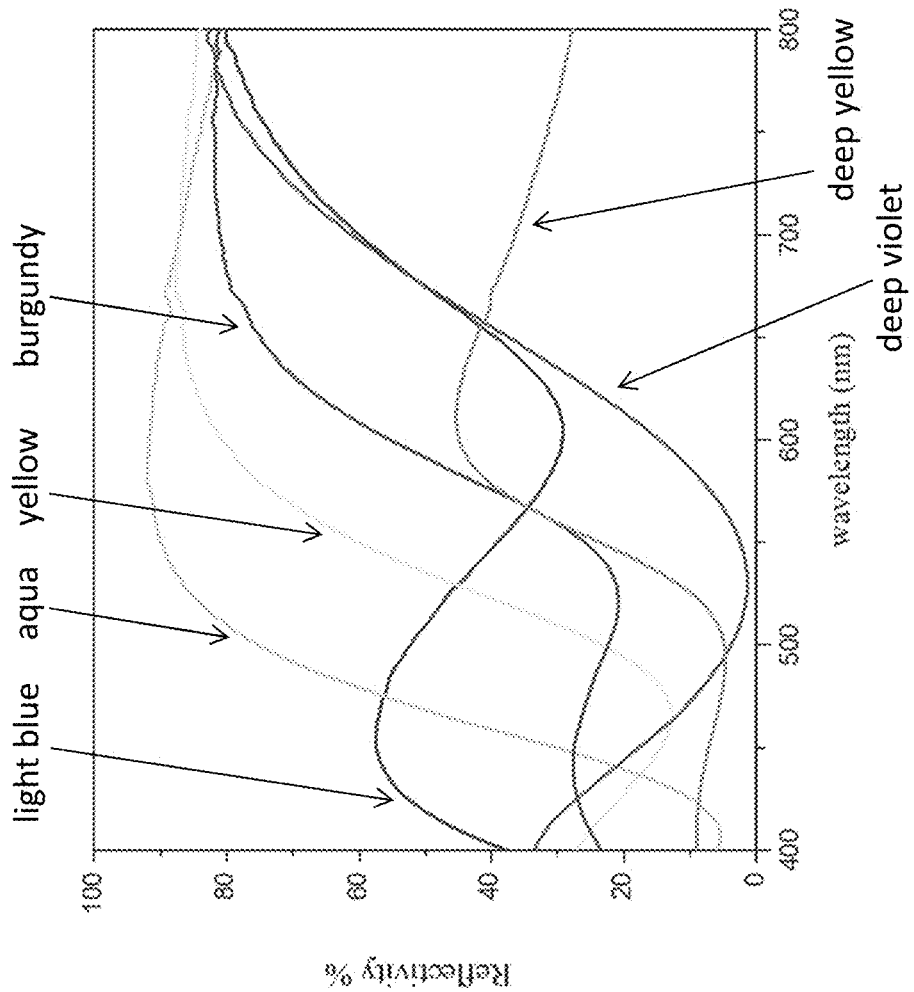
FIG. 8c shows reflectivity spectra of the as-prepared Mg-based thin film.
Figure 8B:
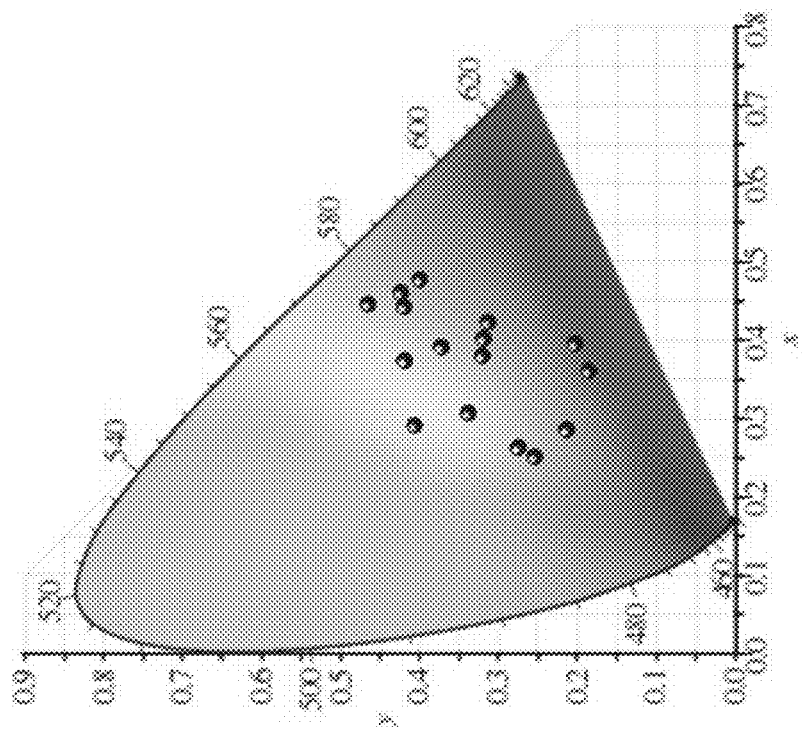
FIG. 8b is a CIE 1931 chromaticity diagram of films prepared by synergistic effect of oxygen vacancies and interference effect.

In one example embodiment, there is provided a plurality of films 100 with different colours as shown in FIG. 8a, each of which are formed by depositing MgZnCaO films 120 with different thicknesses on Si wafer 140 with different reflectivity. FIGS. 8b and 8c show the chromaticity diagram and reflectance spectra of samples adjusted by O₂ flux and thin film thickness respectively. Samples with different colours are reflected at different light wavelength and each of their maximum reflectivity is distributed at different wavelengths respectively.

The invention provides a new routine for the design of optical hard coating. For instance, 5G will rely on much higher-frequency spectrum than the present 4G mobile networks. Although higher frequencies deliver multi-gigabit speeds, higher frequency radio waves travel less distance and fail to penetrate through objects well. Advantageously, the multi-layer film 100 of the present invention may be used in various applications such as smart device casing. Such casing may provide adequate physical protection to the device, yet the film is wavelength permeable such that the signal would not be blocked by the casing.

It will be appreciated by persons skilled in the art that numerous variations and/or modifications may be made to the present invention as shown in the specific embodiments without departing from the spirit or scope of the invention as broadly described. The present embodiments are, therefore, to be considered in all respects as illustrative and not restrictive.

It will also be appreciated by persons skilled in the art that the present invention may also include further additional modifications made to the method which does not affect the overall functioning of the method.

Any reference to prior art contained herein is not to be taken as an admission that the information is common general knowledge, unless otherwise indicated. It is to be understood that, if any prior art information is referred to herein, such reference does not constitute an admission that the information forms a part of the common general knowledge in the art, any other country.

The invention claimed is:

1. A nanostructured film, comprising
    a first layer for reflecting at least a portion of an electromagnetic radiation; and
    a second layer for receiving the remainder of the electromagnetic radiation through the first layer and subsequently reflecting at least a portion of the received electromagnetic radiation through the first layer;
    wherein two electromagnetic radiations with the same wavelength reflected by the first and second layers respectively are combined to form a strengthened electromagnetic radiation, the wavelength of the strengthened electromagnetic radiation being variable based on a physical property of the first layer, and wherein: (a) the first layer is dual-phase or (b) the second layer is an amorphous metallic layer or (c) both the first layer is a dual-phase and the second layer is an amorphous metallic layer.

2. The nanostructured film according to claim 1, wherein the wavelength of the electromagnetic radiation reflected by the first layer is manipulated by the physical property.

3. The nanostructured film according to claim 1, wherein the physical property includes at least one of the reflectivity and the dimension.

4. The nanostructured film according to claim 1, wherein the two reflected electromagnetic radiations interact with each other to form a visible electromagnetic radiation with a predetermined colour.

5. The nanostructured film according to claim 4, wherein the two reflected electromagnetic radiations with the same wavelength form the visible electromagnetic radiation by way of constructive interference.

6. The nanostructured film according to claim 1, wherein the first layer is arranged to undergo chemical reaction with oxygen and the reflectivity of the first layer is manipulated by content of the oxygen in the chemical reaction.

7. The nanostructured film according to claim 6, wherein the reflectivity of the first layer is proportional to the oxygen content.

8. The nanostructured film according to claim 6, wherein the electronic structure of the first layer is manipulated by the oxygen content and the colour of the film is manipulated by the electronic structure.

9. The nanostructured film according to claim 8, wherein a portion of the electromagnetic radiation is absorbed by the electrons in the electronic structure of the first layer.

10. The nanostructured film according to claim 1, wherein the dual-phase includes at least one of crystalline phase and amorphous phase.

11. The nanostructured film according to claim 10, wherein the first layer is a layer of metal-oxide with nanocrystals embedded in an amorphous matrix.

12. The nanostructured film according to claim 1, wherein the reflectivity of the first layer is manipulated by the thickness of the first layer.

13. The nanostructured film according to claim 12, wherein the reflectivity of the first layer is proportional to the thickness of the first layer.

14. The nanostructured film according to claim 1, wherein the first layer has a reflectance ranged from 10% to 100%.

15. The nanostructured film according to claim 1, wherein the second layer is metal or non-metal.

16. The nanostructured film according to claim 15, wherein the second layer is a non-metal selected from Si wafer, fused $SiO_2$, glass, ceramics and polymer.

17. The nanostructured film according to claim 1, wherein the first layer has a thickness equal to or greater than 1 nm.

18. The nanostructured film according to claim 17, wherein the first layer has a roughness of no more than 100 nm.

19. The nanostructured film according to claim 1, wherein the first layer is non-metal.

20. The nanostructured film according to claim 1, wherein the first layer includes metal oxide.

21. The nanostructured film according to claim 20, wherein the metal is selected from a group comprising Mg, Zn, Ca, Al, Ti and the combination thereof.

22. The nanostructured film according to claim 1, wherein the first layer is formed by at least one of magnetron sputtering, vacuum evaporation, sputter coating, plasma coating, and ion plating.

23. The nanostructured film according to claim 1, wherein the nanostructured film has a Vickers hardness of no less than 2 GPa.

* * * * *